United States Patent
Liao et al.

(10) Patent No.: US 7,377,791 B2
(45) Date of Patent: May 27, 2008

(54) ELECTRICAL CONNECTOR ASSEMBLY

(75) Inventors: Fang-Jun Liao, Tu-Cheng (TW); Shuo-Hsiu Hsu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/724,386

(22) Filed: Mar. 14, 2007

(65) Prior Publication Data

US 2007/0218758 A1    Sep. 20, 2007

(30) Foreign Application Priority Data

Mar. 14, 2006    (CN)    .................. 2006 2 0070310 U

(51) Int. Cl.
*H01R 12/00* (2006.01)

(52) U.S. Cl. ....................................................... 439/71

(58) Field of Classification Search .................. 439/70, 439/71
See application file for complete search history.

(56) References Cited

U.S. PATENT DOCUMENTS

| 6,881,073 B2 * | 4/2005 | Bali et al. ...................... 439/70 |
| 7,059,869 B2 * | 6/2006 | Wertz et al. ................... 439/71 |

* cited by examiner

*Primary Examiner*—Phuong Dinh
(74) *Attorney, Agent, or Firm*—Wei Te Chung

(57) ABSTRACT

An electrical connector assembly comprises an insulative housing (11), a plurality terminals received in the housing (11), a locating frame (12) mounted on an upper surface of the housing (11), a plurality of locating pins (15) for connecting the locating frame (12) and the housing (11) to the printed circuit board (14). The housing (11) defines a plurality of receiving holes (111), which defines a plurality of spaced deformable retaining portions (112) separately on the inner wall thereof, and each deformable retaining portion (112) defines two slant surfaces (113) on two sides thereof.

2 Claims, 4 Drawing Sheets

US 7,377,791 B2

ELECTRICAL CONNECTOR ASSEMBLY

BACKGROUND OF THE INVENTION

1. Field of the Invention

The present invention relates to the art of electrical connector assemblies, and more particularly to an electrical connector assembly provided for mechanically and electrically connecting chip modules to printed circuit boards (PCBS).

2. Description of the Prior Art

Electrical connector assemblies are widely used in the connector industry for electrically connecting chip modules to printed circuit boards (PCBs) in personal computer.

A conventional electrical connector assembly comprises an insulative housing, a plurality of terminals received in corresponding passageways of the housing, a locating frame mounted on an upper surface of the housing and a plurality of locating pins for connecting the housing and the locating frame to the printed circuit board. The housing defines a number of smoothly receiving holes for receiving the locating pin therein and the locating frame and the printed circuit board each define a plurality of first through holes and second through holes in correspondence with the receiving holes of the housing. In assembly, the terminals are inserted into the housing and then soldered to the printed circuit board. Successively the locating frame is mounted on the housing with the first holes in line with the receiving holes and the second holes. At last, the locating pins are inserted through the first through holes, the receiving holes and the second holes in turn and engages interferentially with the holes, thereby the locating frame and the housing are connected to the printed circuit board.

However, in the electrical connector assembly described in above context, the receiving holes of the housing are smoothly defined which makes a greater contacting surface between inner walls of the receiving holes and the locating pins. So there need a greater force, when the locating pins are inserted into the receiving holes, which make the assembly more difficult. In addition, the locating pin is usually made of metal material and the housing is made of insulative material. When the temperate changes, the size of the receiving holes opening on the housing make a greater change than the size of the locating pin, thereby the locating pin do not engage with the receiving holes, which influences the engagement between the locating pin and the housing.

Thus, there is a need to provide a new connector assembly that overcomes the above-mentioned problems.

SUMMARY OF THE INVENTION

Accordingly, an object of the present invention is to provide an electrical connector assembly able to abbreviate the force for inserting locating pins therein.

To fulfill the above-mentioned object, an electrical connector assembly in accordance with a preferred embodiment comprises an insulative housing, a plurality of terminals received in the housing, a locating frame mounted on an upper surface of the housing, a plurality of locating pins for connecting the locating frame and the housing to the printed circuit board. The housing defines a plurality of receiving holes, which defines a plurality of deformable retaining portions separately on the inner wall thereof and each deformable retaining portion defines two slant surfaces on two sides thereof.

Relative to the present technology, the electrical connector assembly in accordance with the preferred embodiment of the invention defines a plurality of deformable retaining portions, which can decrease the interferential surface between the locating pins and the receiving holes and diminish the force used for inserting the locating pin into the receiving holes.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
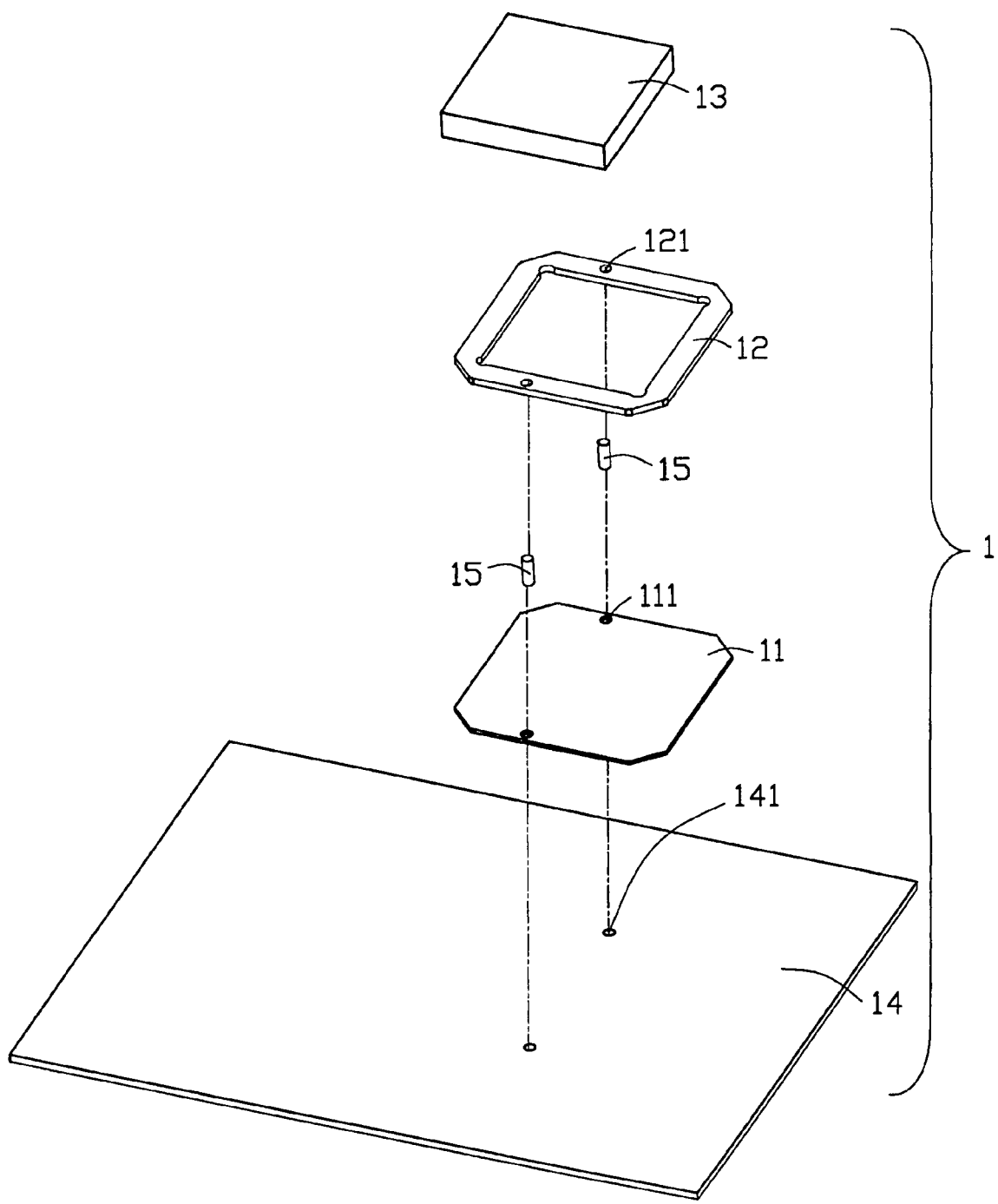
FIG. 1 is an exploded, isometric view of an electrical connector assembly in accordance with a preferred embodiment of the present invention, a chip module and a printed circuit board.
Figure 2:
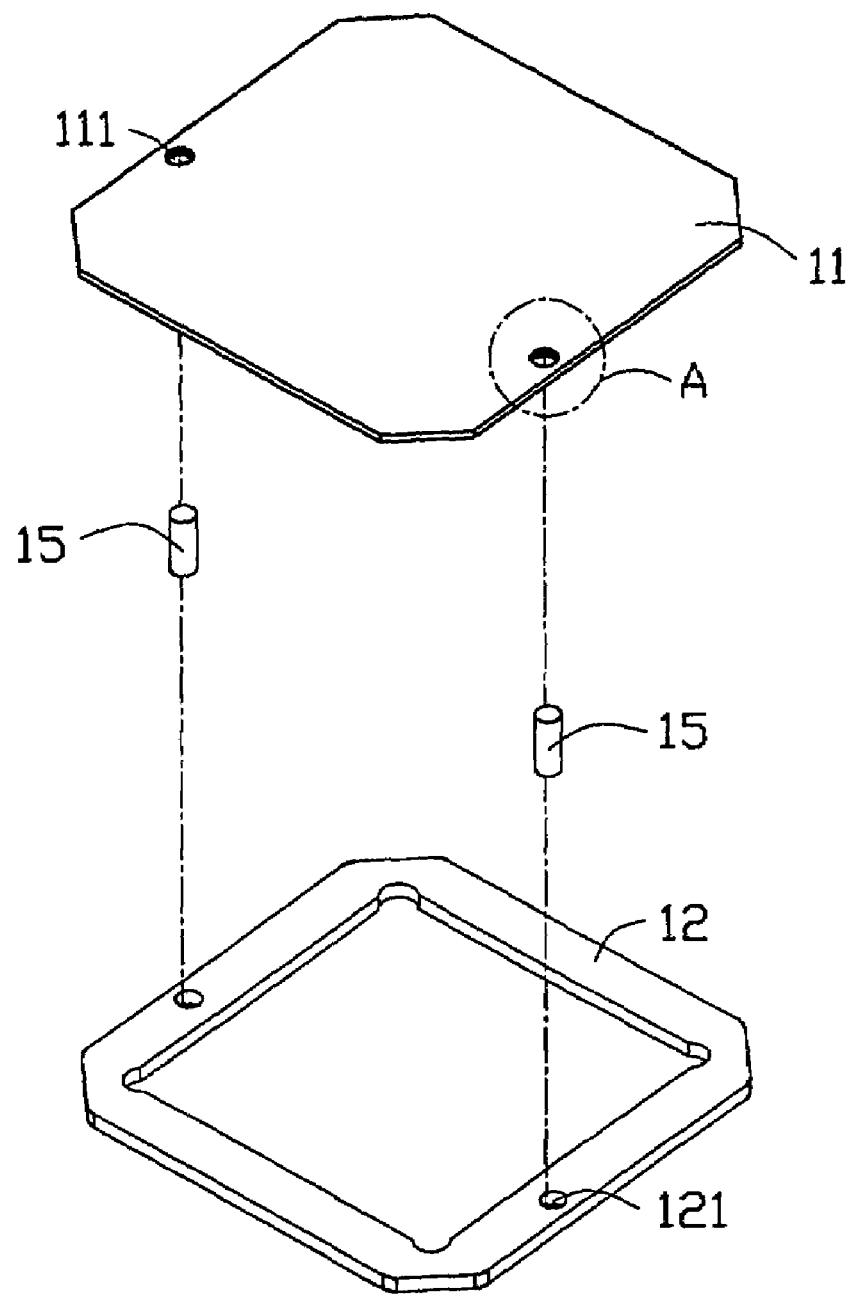
FIG. 2 is an other perspective view of the housing engaged with the locating pin of the electrical connector assembly in FIG. 1.
Figure 3:
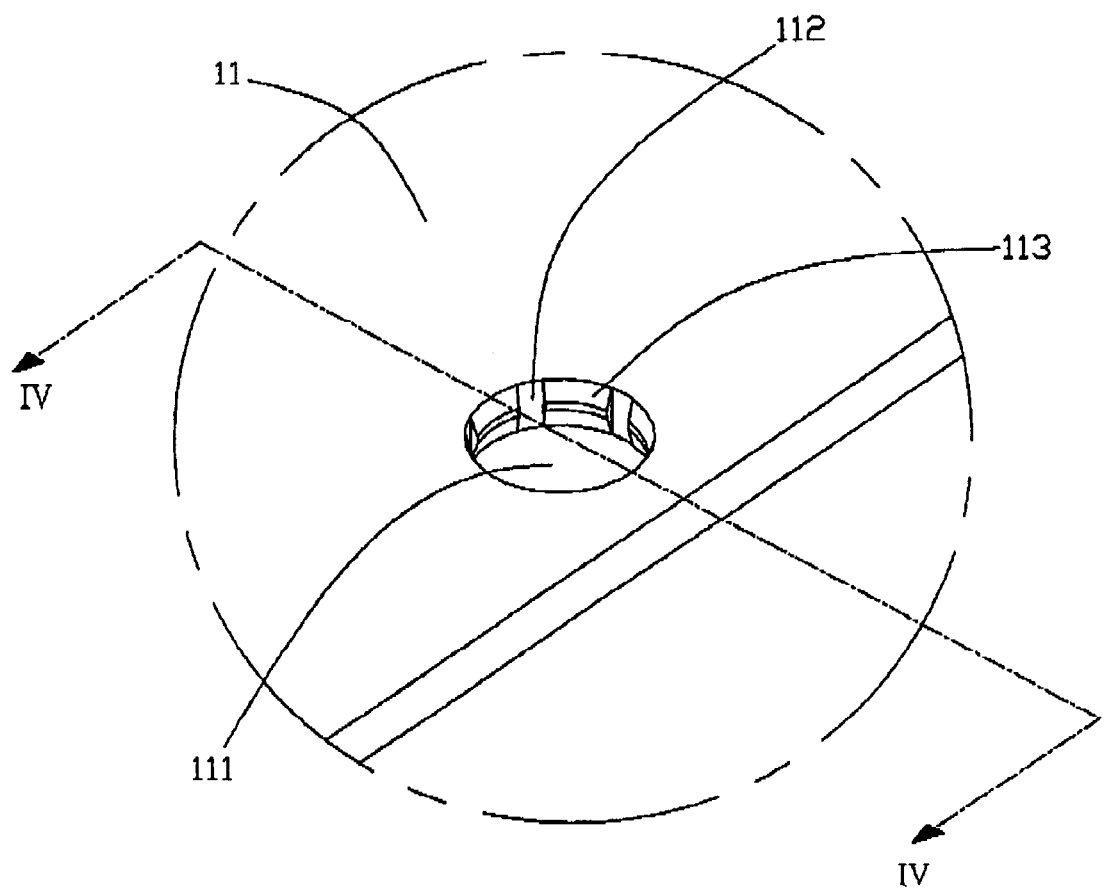
FIG. 3 is an enlarged view of a circle A in the housing shown in FIG. 2.
Figure 4:
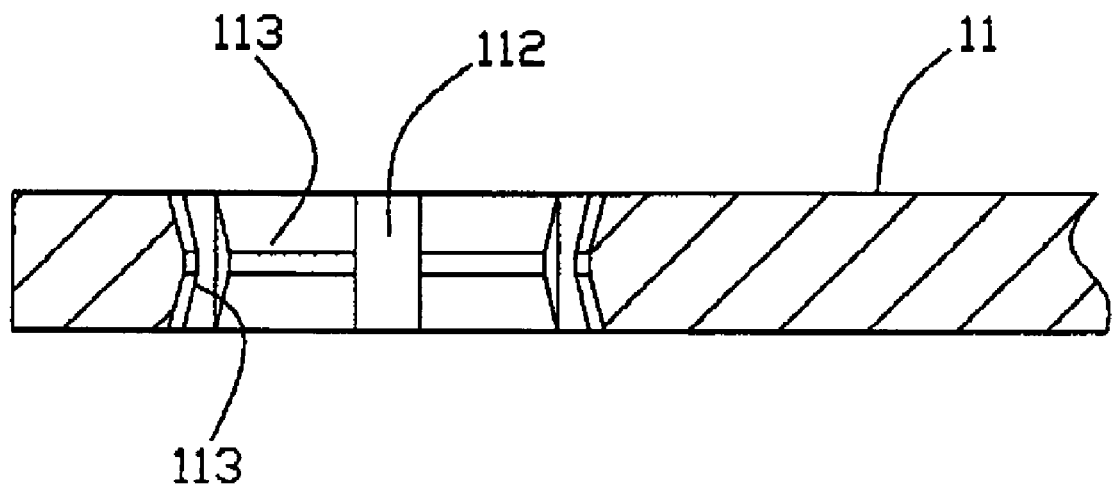
FIG. 4 is an enlarged cross-section view in FIG. 3 along the IV-IV line.

An exploded, isometric view of an electrical connector assembly in accordance with the preferred embodiment of the present invention is shown in FIGS. 1-3. The electrical connector assembly 1 provided for electrically connecting a chip module 13 to a PCB 14 includes a generally rectangular insulative housing 11, a multiplicity of terminals received in the housing 11, a locating frame 12 mounted on an upper surface of the housing 11 and a plurality of locating pins 15 for connecting the locating frame 12 and the housing 11 to the printed circuit board 14.

The plate-like housing 11 includes a conducting section defined a plurality of passageways for receiving terminals therein and a number of receiving holes 111 disposed on two sides thereof for receiving the locating pin 15 therein. Each receiving hole 111 defines a plurality of deformable retaining portions 112 spaced each other and each deformable retaining portion 112 disposes two slant surface 113 on two sides thereof. The slant surfaces 113 simplify and lead the terminal inserting. In conclusion, the interfering deformable retaining portion 112 and the slant surface 113 diminish the contacting surface between the locating pin 15 and the receiving hole 111, which decreases the inserting force needed for mounting the in terminals.

The locating frame 12 is mode of metal material and hollow in center and defines a plurality first through holes 121 matching along with the receiving holes 111 of the housing 11.

The printed circuit board 14 is mode of metal material too and defines a plurality second through holes 141 in correspondence with receiving holes 111 of the housing 11.

The locating pin 15 is a smooth metal column, which is inserted through the first through hole 121, the receiving hole 111, the second through hole 131 in turn for connecting the locating frame 12, the housing 11 to the printed circuit board 13.

In assembly, the terminals firstly are inserted through the housing 11. Then the housing 11 with terminals is soldered to the printed circuit board 14. At this moment, the receiving holes 111 are locating above the second through holes 131. Successively, the locating frame 12 is mounted above the housing 11 making the first through hole 121 in line with the receiving hole 111 of the housing 11. At last, the locating pins 15 is inserted into the first through hole 121, the receiving hole 111 and the second through hole 141 in turn to connecting the locating frame 12, the housing 11, and the printed circuit board 14 together.

In conclusion, the housing 11 of the electrical connector assembly 1 in accordance with the invention defines a number of receiving holes 111 with a plurality of spaced deformable retaining portions 112 and the slant surfaces 113 on the deformable retaining portions 112, which decreases the contacting surface between the locating pin 15 and inner walls of the receiving hole 111 and diminishes the force for inserting the terminals into the receiving holes 111.

In addition, the spaced deformable retaining portions can be defined on the outer surface of two ends of the locating pin too, which also provides a diminishing contacting surface and a decreasing force for inserting the locating pin to the receiving holes.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An electrical connector assembly comprising:

an insulative housing defines a number of passageways thereof and at least a receiving hole;

a plurality of electrical terminals received in the passageways of the housing;

at least a locating pin positioned in the at least a receiving hole of the housing;

wherein the receiving holes defines at least three spaced retaining portions, each of the retaining portions defining at least a slant surfaces at opposite ends which enables the at least a locating pin to be inserted, wherein further comprising a locating frame mounted on the housing defines at least a first through hole corresponding to said at least receiving hole, wherein the number of receiving holes is two and wherein said at least a slant surfaces includes two slant surfaces on two lateral sides of the receiving portion.

2. An electrical connector assembly comprising:

an insulative housing defining a receiving hole;

a locating frame located upon the housing and defining a first through hole in alignment with the receiving hole;

a printed circuit board located under the housing and defining a second through hole in alignment with the receiving hole;

a locating pin extending through said first through hole, said receiving hole and said second through hole sequentially; wherein at least three inwardly protruding retaining portions are formed on an interior edge of the receiving hole at intervals for retention with the locating pin, and each of said retaining portions defines at least one slant surface at two opposite ends thereof in a vertical, wherein there two of said slant surface located at both said opposite ends, respectively.

* * * * *